US012648460B2

(12) United States Patent
Yang

(10) Patent No.: US 12,648,460 B2
(45) Date of Patent: Jun. 2, 2026

(54) PACKAGE STRUCTURE INCLUDING AT LEAST TWO ELECTRONIC COMPONENTS AND METHOD FOR MANUFACTURING THE SAME

(71) Applicant: NANYA TECHNOLOGY CORPORATION, New Taipei City (TW)

(72) Inventor: Wu-Der Yang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 383 days.

(21) Appl. No.: 18/379,873

(22) Filed: Oct. 13, 2023

(65) Prior Publication Data

US 2024/0203887 A1 Jun. 20, 2024

Related U.S. Application Data

(62) Division of application No. 18/084,676, filed on Dec. 20, 2022, now Pat. No. 12,394,721.

(51) Int. Cl.
*H01L 23/538* (2006.01)
*H01L 23/00* (2006.01)
(Continued)

(52) U.S. Cl.
CPC .......... *H10W 70/611* (2026.01); *H10W 70/68* (2026.01); *H10W 70/685* (2026.01);
(Continued)

(58) Field of Classification Search
CPC . H01L 23/5383; H01L 23/13; H01L 23/3121; H01L 24/16; H01L 25/105;
(Continued)

(56) References Cited

U.S. PATENT DOCUMENTS

| | | | |
|---|---|---|---|
| 11,164,817 B2 | 11/2021 | Rubin et al. | |
| 2004/0113281 A1* | 6/2004 | Brandenburg | ...... H01L 23/3128 257/E25.023 |

(Continued)

FOREIGN PATENT DOCUMENTS

| TW | 202245198 A | 11/2022 |
|---|---|---|

OTHER PUBLICATIONS

Office Action and and the search report mailed on May 21, 2025 related to U.S. Appl. No. 18/084,676, wherein this application is a DIV of U.S. Appl. No. 18/084,676.
(Continued)

*Primary Examiner* — Peniel M Gumedzoe
(74) *Attorney, Agent, or Firm* — Xuan Zhang

(57) ABSTRACT

A package structure and a method of manufacturing a package structure are provided. The package structure includes a first substrate, a first electronic component, a second electronic component and a second substrate. The first electronic component is disposed over and electrically connected to the first substrate. An active surface of the first electronic component faces the first substrate. The second electronic component is disposed under and electrically connected to the first substrate. An active surface of the second electronic component faces the first substrate. The second substrate is disposed under and electrically connected to the first substrate. The second substrate defines a cavity for accommodating the second electronic component.

11 Claims, 13 Drawing Sheets

(51) Int. Cl.
| | |
|---|---|
| *H01L 23/13* | (2006.01) |
| *H01L 23/31* | (2006.01) |
| *H01L 25/10* | (2006.01) |
| *H10W 70/60* | (2026.01) |
| *H10W 70/68* | (2026.01) |
| *H10W 70/685* | (2026.01) |
| *H10W 74/10* | (2026.01) |
| *H10W 90/00* | (2026.01) |

(52) U.S. Cl.
CPC .......... *H10W 74/114* (2026.01); *H10W 90/00* (2026.01); *H10W 90/724* (2026.01)

(58) Field of Classification Search
CPC ...... H01L 2224/16227; H10W 70/611; H10W 70/685; H10W 70/68; H10W 74/114; H10W 90/00; H10W 90/724
See application file for complete search history.

(56) References Cited

U.S. PATENT DOCUMENTS

| | | | |
|---|---|---|---|
| 2008/0157322 A1* | 7/2008 | Tang ..................... | H10W 90/00 257/E23.18 |
| 2019/0074264 A1 | 3/2019 | Chen et al. | |
| 2019/0304952 A1 | 10/2019 | Weis et al. | |
| 2022/0367399 A1 | 11/2022 | Lin et al. | |

OTHER PUBLICATIONS

Office Action and and the search report mailed on Nov. 11, 2024 related to Taiwanese Application No. 113103473.
Office Action and and the search report mailed on May 27, 2024 related to Taiwanese Application No. 112118518.

* cited by examiner

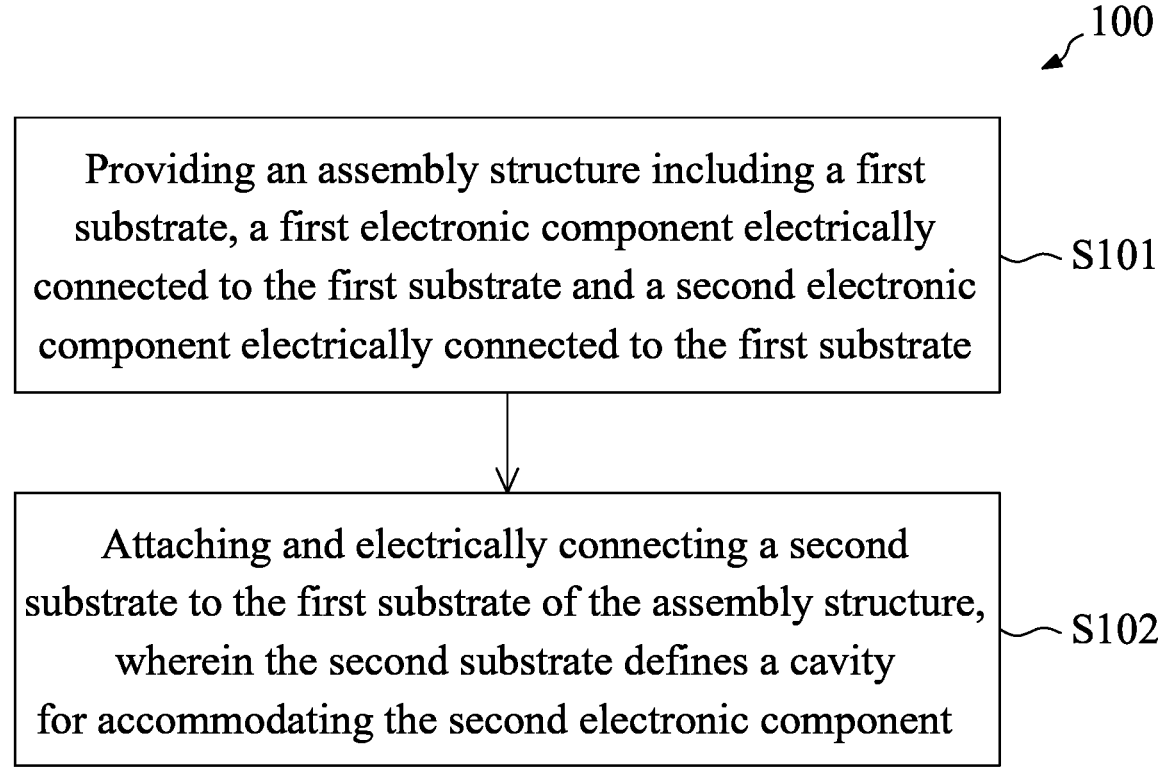

100

Providing an assembly structure including a first substrate, a first electronic component electrically connected to the first substrate and a second electronic component electrically connected to the first substrate

S101

Attaching and electrically connecting a second substrate to the first substrate of the assembly structure, wherein the second substrate defines a cavity for accommodating the second electronic component

PACKAGE STRUCTURE INCLUDING AT LEAST TWO ELECTRONIC COMPONENTS AND METHOD FOR MANUFACTURING THE SAME

CROSS-REFERENCE TO RELATED APPLICATION

This application is a divisional application of U.S. Non-Provisional application Ser. No. 18/084,676 filed Dec. 20, 2022, which is incorporated herein by reference in its entirety.

TECHNICAL FIELD

The present disclosure relates to a package structure and a method for manufacturing a package structure, and more particularly, to a package structure including at least two electronic components.

DISCUSSION OF THE BACKGROUND

In a window ball grid array (WBGA) package, a substrate may define a window over an electronic component. The electronic component may be electrically connected to the substrate through a wire-bonding process. That is, the electrical connection between the electronic component and the substrate may be accomplished by golden bonding wires in the window of the substrate. The advantage of such wire-bonding process is low cost. However, such WBGA package can not transmit high-frequency signals.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a package structure. The package structure includes a first substrate, a first electronic component, a second electronic component and a second substrate. The first electronic component is disposed over and electrically connected to the first substrate. An active surface of the first electronic component faces the first substrate. The second electronic component is disposed under and electrically connected to the first substrate. An active surface of the second electronic component faces the first substrate. The second substrate is disposed under and electrically connected to the first substrate. The second substrate defines a cavity for accommodating the second electronic component.

Another aspect of the present disclosure provides a package structure. The package structure includes a first substrate, a first electronic component, a second electronic component and a second substrate. The first electronic component is electrically connected to the first substrate. The second electronic component is electrically connected to the first substrate. The first substrate is disposed between the first electronic component and the second electronic component. The second substrate is spaced apart from and electrically connected to the first substrate. At least a portion of the second electronic component is embedded in the second substrate.

Another aspect of the present disclosure provides a method of manufacturing a package structure. The method includes: providing an assembly structure including a first substrate, a first electronic component electrically connected to the first substrate and a second electronic component electrically connected to the first substrate; and attaching and electrically connecting a second substrate to the first substrate of the assembly structure, wherein the second substrate defines a cavity for accommodating the second electronic component.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

FIG. 13 illustrates a flow chart of a method of manufacturing a package structure in accordance with some embodiments of the present disclosure.

DETAILED DESCRIPTION

Figure 1:
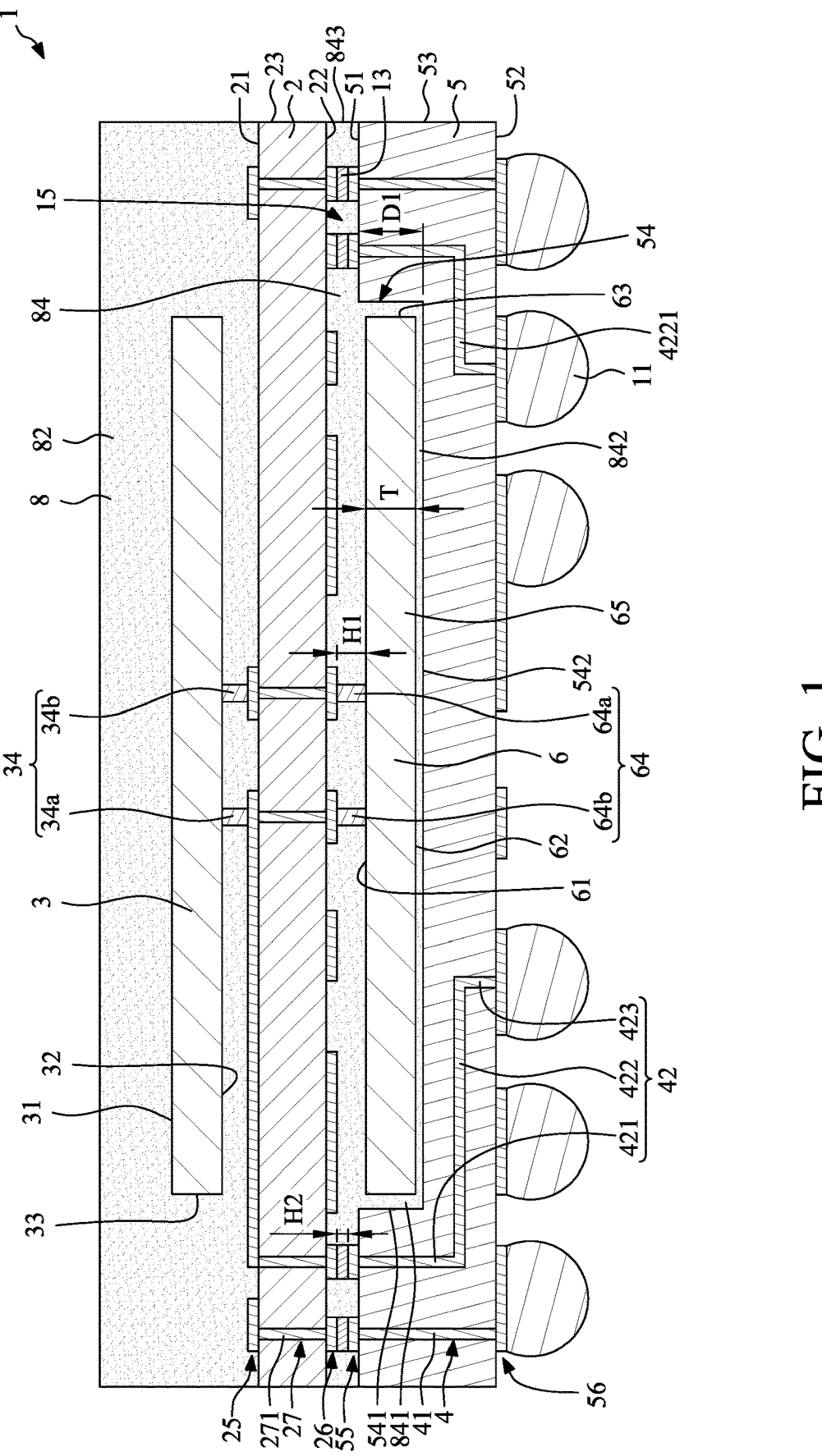
FIG. 1 is a schematic cross-sectional view of a package structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic cross-sectional view of a package structure 1 in accordance with some embodiments of the present disclosure. The package structure 1 may be a ball grid array (BGA) package. As shown in FIG. 1, in some embodiments, the package structure 1 may include a first substrate 2, a first electronic component 3, a second substrate 5, a second electronic component 6, a package body 8, at least one internal connector 13 and a plurality of external connectors 11.

In some embodiments, the first substrate 2 may include semiconductor materials such as silicon, germanium, gallium, arsenic, and combinations thereof. In some embodiments, the first substrate 2 may include organic material, glass, ceramic material or the like. For example, the first substrate 2 may be made of a cured photoimageable dielectric (PID) material such as epoxy or polyimide (PI) including photoinitiators. For example, the first substrate 2 may include a homogeneous material. For example, the material of the first substrate 2 may include epoxy type FR5, FR4, Bismaleimide triazine (BT), print circuit board (PCB) material, Prepreg (PP), Ajinomoto build-up film (ABF) or other suitable materials.

The first substrate 2 may have a first surface 21 (e.g., a top surface), a second surface 22 (e.g., a bottom surface) and a lateral surface 23. The second surface 22 (e.g., the bottom surface) may be opposite to the first surface 21 (e.g., the top surface). The lateral surface 23 may extend between the first surface 21 (e.g., the top surface) and the second surface 22 (e.g., the bottom surface).

The first substrate 2 may include a first patterned circuit layer 25, a second patterned circuit layer 26 and a first inner connection structure 27. The first patterned circuit layer 25 may be disposed adjacent to the first surface 21 (e.g., the top surface) of the first substrate 2. The first patterned circuit layer 25 may be a fan-out circuit layer or a redistribution layer (RDL). The first patterned circuit layer 25 may be disposed on the first surface 21 (e.g., the top surface) of the first substrate 2. A material of the first patterned circuit layer 25 may include copper (Cu), silver (Ag), aluminum (Al), gold (Au), or an alloy thereof. For example, the first patterned circuit layer 25 may be formed or patterned from a metal foil such as a copper foil. The first patterned circuit layer 25 may include a plurality of traces and a plurality of connecting pads.

The second patterned circuit layer 26 may be disposed adjacent to the second surface 22 (e.g., the bottom surface) of the first substrate 2. The second patterned circuit layer 26 may be a fan-out circuit layer or a redistribution layer (RDL). The second patterned circuit layer 26 may be disposed on the second surface 22 (e.g., the bottom surface) of the first substrate 2. A material of the second patterned circuit layer 26 may include copper (Cu), silver (Ag), aluminum (Al), gold (Au), or an alloy thereof. For example, the second patterned circuit layer 26 may be formed or patterned from a metal foil such as a copper foil. The second patterned circuit layer 26 may include a plurality of traces and a plurality of connecting pads.

The first inner connection structure 27 may be disposed in the first substrate 2, and may be used for electrically connecting the first patterned circuit layer 25 and the second patterned circuit layer 26 of the first substrate 2. In some embodiments, the first inner connection structure 27 may include a plurality of through vias 271 disposed in the first substrate 2 and extending through the first substrate 2. That is, the through vias 271 may extend between the first surface 21 (e.g., the top surface) and the second surface 22 (e.g., the bottom surface). Two ends of the through via 271 may be connected to the first patterned circuit layer 25 and the second patterned circuit layer 26 respectively.

As shown in FIG. 1, there may be an inner (or vertical) electrical connection (or electrical path) within the first substrate 2 due to the first inner connection structure 27 (e.g., the through via 271). Thus, there may be an electrical connection between the first surface 21 of the first substrate 2 and the second surface 22 of the first substrate 2.

In some embodiments, the first electronic component 3 may include a semiconductor die or a chip, such as a memory die (e.g., dynamic random access memory (DRAM) die, static random access memory (SRAM) die, etc.), a signal processing die (e.g., digital signal processing (DSP) die), a logic die (e.g., application processor (AP), system-on-a-chip (SoC), central processing unit (CPU), graphics processing unit (GPU), microcontroller, etc.), a power management die (e.g., power management integrated circuit (PMIC) die), a radio frequency (RF) die, a sensor die, a micro-electro-mechanical-system (MEMS) die, a front-end die (e.g., analog front-end (AFE) dies) or other active components.

The first electronic component 3 may be disposed over the first surface 21 of the first substrate 2, and may be attached to the first surface 21 of the first substrate 2. The first electronic component 3 may have a first active surface 32 (e.g., a bottom surface), a first backside surface 31 (e.g., a top surface) and a plurality of first lateral surfaces 33. The first active surface 32 (e.g., the bottom surface) may face the first substrate 2. The first backside surface 31 (e.g., the top surface) may be opposite to the first active surface 32 and may face away from the first substrate 2. The first lateral surfaces 33 may extend between the first active surface 32 and the first backside surface 31.

The first electronic component 3 may include at least one first bump 34 disposed adjacent to the first active surface 32 of the first electronic component 3. The first bump 34 may include an electrical contact such as a pad, a pillar, or a stud. For example, the first bump 34 may include a first bump 34a and a first bump 34b. The first active surface 32 of the first electronic component 3 may be electrically connected to the first patterned circuit layer 25 of the first substrate 2 through the first bump(s) 34a, 34b. As shown in FIG. 1, the first electronic component 3 may be electrically connected to and attached to the first substrate 2 through flip-chip bonding.

In some embodiments, the second electronic component 6 may include a semiconductor die or a chip, such as a memory die (e.g., dynamic random access memory (DRAM) die, static random access memory (SRAM) die, etc.), a signal processing die (e.g., digital signal processing (DSP) die), a logic die (e.g., application processor (AP), system-on-a-chip (SoC), central processing unit (CPU), graphics processing unit (GPU), microcontroller, etc.), a power management die (e.g., power management integrated circuit (PMIC) die), a radio frequency (RF) die, a sensor die, a micro-electro-mechanical-system (MEMS) die, a front-end die (e.g., analog front-end (AFE) dies) or other active components.

The second electronic component 6 may be disposed under the second surface 22 of the first substrate 2, and may be attached to the second surface 22 of the first substrate 2. The second electronic component 6 may have a second active surface 61 (e.g., a top surface), a second backside surface 62 (e.g., a bottom surface) and a plurality of second lateral surfaces 63. The second active surface 61 (e.g., the top surface) may face the first substrate 2. The second backside surface 62 (e.g., the bottom surface) may be opposite to the second active surface 61 and may face away from the first substrate 2. The second lateral surfaces 63 may extend between the second active surface 61 and the second backside surface 62. As shown in FIG. 1, the second active surface 61 of the second electronic component 6 faces upward, and the first active surface 32 of the first electronic component 3 faces downward. Both of the second active surface 61 of the second electronic component 6 and the first active surface 32 of the first electronic component 3 face toward the first substrate 2. Thus, the first substrate 2 may be disposed between the first electronic component 3 and the second electronic component 6.

The second electronic component 6 may include at least one second bump 64 disposed adjacent to the second active surface 61 of the second electronic component 6. The second bump 64 may include an electrical contact such as a pad, a pillar, or a stud. For example, the second bump 64 may include a second bump 64a and a second bump 64b. The second active surface 61 of the second electronic component 6 may be electrically connected to the second patterned circuit layer 26 of the first substrate 2 through the second bump(s) 64a, 64b. As shown in FIG. 1, the second electronic component 6 may be electrically connected to and attached to the first substrate 2 through flip-chip bonding.

In some embodiments, the second electronic component 6 may be same as or similar to the first electronic component 3. That is, a circuit layout of the second active surface 61 of the second electronic component 6 may be same as a circuit layout of the first active surface 32 of the first electronic component 3. For example, the second bump 64a of the second electronic component 6 may be aligned with the first bump 34b of the first electronic component 3. The second bump 64b of the second electronic component 6 may be aligned with the first bump 34a of the first electronic component 3. In addition, the electrical function of the second bump 64a of the second electronic component 6 may be same as the electrical function of the first bump 34a of the first electronic component 3, and the electrical function of the second bump 64b of the second electronic component 6 may be same as the electrical function of the first bump 34b of the first electronic component 3. That is, a layout of the first bump(s) 34 (including the first bumps 34a, 34b) of the first electronic component 3 may be same as a layout of the second bump(s) 64 (including the second bumps 64a, 64b) of the second electronic component 6.

In some embodiments, the second electronic component 6 may be substantially aligned with the first electronic component 3. For example, the lateral surface 63 of the second electronic component 6 may be substantially aligned with the lateral surface 33 of the first electronic component 3.

In some embodiments, the second substrate 5 may include semiconductor materials such as silicon, germanium, gallium, arsenic, and combinations thereof. In some embodiments, the second substrate 5 may include organic material, glass, ceramic material or the like. For example, the second substrate 5 may be made of a cured photoimageable dielectric (PID) material such as epoxy or polyimide (PI) including photoinitiators. For example, the second substrate 5 may include a homogeneous material. For example, the material of the second substrate 5 may include epoxy type FR5, FR4, Bismaleimide triazine (BT), print circuit board (PCB) material, Prepreg (PP), Ajinomoto build-up film (ABF) or other suitable materials.

The second substrate 5 may be disposed under and electrically connected to the first substrate 2. The second substrate 5 may have a first surface 51 (e.g., a top surface), a second surface 52 (e.g., a bottom surface) and a lateral surface 53. The second surface 52 (e.g., the bottom surface) may be opposite to the first surface 51 (e.g., the top surface). The lateral surface 53 may extend between the first surface 51 (e.g., the top surface) and the second surface 52 (e.g., the bottom surface). The second substrate 5 may define a cavity 54 for accommodating at least a portion 65 of the second electronic component 6. Alternatively, at least a portion 65 of the second electronic component 6 may be embedded in the second substrate 5. The second substrate 5 may be a cavity substrate. The cavity 54 may be recessed from the first surface 51 (e.g., the top surface) of the second substrate 5. The cavity 54 may have a plurality of sidewalls 541 (or a plurality of side surfaces) and a bottom wall 542 (or a bottom surface). The sidewalls 541 of the cavity 54 may extend between the first surface 51 (e.g., the top surface) of the second substrate 5 and the bottom wall 542 of the cavity 54. The cavity 54 may not extend through the second substrate 5.

A depth D1 of the cavity 54 may be greater than a thickness T of the second electronic component 6. Thus, an elevation (or a level) of the second active surface 61 of the second electronic component 6 may be lower than an elevation (or a level) of the first surface 51 (e.g., the top surface) of the second substrate 5.

The second substrate 5 may include a first patterned circuit layer 55, a second patterned circuit layer 56 and a second inner connection structure 4. The first patterned circuit layer 55 may be disposed adjacent to the first surface 51 (e.g., the top surface) of the second substrate 5. The first patterned circuit layer 55 may be a fan-out circuit layer or a redistribution layer (RDL). The first patterned circuit layer 55 may be disposed on the first surface 51 (e.g., the top surface) of the second substrate 5. A material of the first patterned circuit layer 55 may include copper (Cu), silver (Ag), aluminum (Al), gold (Au), or an alloy thereof. For example, the first patterned circuit layer 55 may be formed or patterned from a metal foil such as a copper foil. The first patterned circuit layer 55 may include a plurality of traces and a plurality of connecting pads.

The second patterned circuit layer 56 may be disposed adjacent to the second surface 52 (e.g., the bottom surface) of the second substrate 5. The second patterned circuit layer 56 may be a fan-out circuit layer or a redistribution layer (RDL). The second patterned circuit layer 56 may be disposed on the second surface 52 (e.g., the bottom surface) of the second substrate 5. A material of the second patterned circuit layer 56 may include copper (Cu), silver (Ag), aluminum (Al), gold (Au), or an alloy thereof. For example, the second patterned circuit layer 56 may be formed or patterned from a metal foil such as a copper foil. The second patterned circuit layer 56 may include a plurality of traces, a plurality of connecting pads and a plurality of bonding pads. Each of the bonding pads may be an input/output (I/O) terminal pad (such as a ball pad).

The second inner connection structure 4 may be disposed in the second substrate 5, and may be used for electrically connecting the first patterned circuit layer 55 and the second patterned circuit layer 56 of the second substrate 5. In some embodiments, the second inner connection structure 4 may include a plurality of through vias 41 and at least one interconnection structure 42. The through vias 41 may be disposed in the second substrate 5 and extend through the second substrate 5. That is, the through vias 41 may extend between the first surface 51 (e.g., the top surface) and the second surface 52 (e.g., the bottom surface). Two ends of the through via 41 may be connected to the first patterned circuit layer 55 and the second patterned circuit layer 56 respectively.

The interconnection structure 42 may be disposed in the second substrate 5, and may include a first vertical conductive segment 421, a horizontal conductive segment 422 and a second vertical conductive segment 423. At least a portion 4221 of the horizontal conductive segment 422 may be disposed under the cavity 54, and may be spaced apart from the bottom wall 542 of the cavity 54. At least a portion 4221 of the horizontal conductive segment 422 may be located right under the second electronic component 6. Further, the horizontal conductive segment 422 may be spaced apart from the second surface 52 (e.g., the bottom surface) of the second substrate 5. Thus, the horizontal conductive segment 422 may be not exposed from the second substrate 5. The first vertical conductive segment 421 physically connects and electrically connects the first patterned circuit layer 55 and the horizontal conductive segment 422. The second vertical conductive segment 423 physically connects and electrically connects the second patterned circuit layer 56 and the horizontal conductive segment 422.

As shown in FIG. 1, there may be an inner electrical connection (or electrical path) within the second substrate 5 due to the second inner connection structure 4. Thus, there may be an electrical connection between the first surface 51 of the second substrate 5 and the second surface 52 of the second substrate 5. That is, second inner connection structure 4 is used for electrically connecting the first surface 51 and the second surface 52 of the second substrate 5.

The second substrate 5 may be spaced apart from the first substrate 2. The first patterned circuit layer 55 of the second substrate 5 may be attached to and electrically connected to the second patterned circuit layer 26 of the first substrate 2 through the at least one internal connector 13. Thus, the internal connector 13 may physically connect and electrically connect the first substrate 2 and the second substrate 5. A material of the internal connector 13 may include solder material or other suitable conductive material. A height H1 of the second bump 64 (including the second bumps 64a, 64b) may be greater than a height H2 of the internal connector 13.

In some embodiments, the package body 8 may include molding material, such as a Novolac-based resin, an epoxy-based resin, a silicone-based resin, or another suitable encapsulant. Suitable fillers may also be included, such as powdered $SiO_2$. The package body 8 may include a first encapsulant 82 and a second encapsulant 84 formed concurrently. The first encapsulant 82 may cover the first surface 21 of the first substrate 2 and encapsulate the first electronic component 3. The second encapsulant 84 may cover the second surface 22 of the first substrate 2 and the first surface 51 of the second substrate 5. The second encapsulant 84 may fill up the cavity 54 and encapsulate the second electronic component 6. The second encapsulant 84 may further encapsulate at least one of the internal connectors 13.

The second encapsulant 84 may include a first portion 841 and a second portion 842. The first portion 841 may be disposed between the second lateral surfaces 63 of the second electronic component 6 and the sidewalls 541 of the cavity 54. The second portion 842 may be disposed between the second backside surface 62 (e.g., the bottom surface) of the second electronic component 6 and the bottom wall 542 of the cavity 54. Thus, the second encapsulant 84 may encapsulate the second backside surface 62 (e.g., the bottom surface) and the second lateral surfaces 63 of the second electronic component 6. The second encapsulant 84 may be disposed between the second electronic component 6 and the plurality of walls (including the sidewalls 541 and the bottom wall 542) of the cavity 54. As a result, the second electronic component 6 may be electrically insulated from all of the walls (including the sidewalls 541 and the bottom wall 542) of the cavity 54. That is, the second electronic component 6 may be not electrically connected to the second substrate 5 directly. There may be no electrical path passing through the walls (including the sidewalls 541 and the bottom wall 542) of the cavity 54, the second lateral surface 63 of the second electronic component 6 and the second backside surface 62 (e.g., the bottom surface) of the second electronic component 6.

In addition, a portion of the second encapsulant 84 may extend to a space 15 between the second surface 22 of the first substrate 2 and the first surface 51 of the second substrate 5. A lateral surface 843 of the second encapsulant 84 may be aligned with the lateral surface 53 of the second substrate 5 and the lateral surface 23 of the first substrate 2.

The external connectors 11 may be disposed on the bonding pads of the second patterned circuit layer 56 of the second substrate 5 so as to provide electrical connections, for example, I/O connections, of the second substrate 5. For example, the external connectors 11 may include or may be electrically connected to a ground reference node (GND) node, an electrical power node (VDD) node, a voltage node, or a signal node. In some embodiments, the external connectors 11 may include a controlled collapse chip connection (C4) bump, a ball grid array (BGA) or a land grid array (LGA). As shown in FIG. 1, the external connectors 11 may be disposed adjacent to the second surface 52 of the second substrate 5, and may be electrically connected to the first patterned circuit layer 55 through the second inner connection structure 4 in the second substrate 5. That is, the external connectors 11 may be attached to and electrically connected to the second substrate 5 for external connection. In addition, at least one of the external connectors 11 may be disposed right under the second electronic component 6 and the cavity 54. Thus, at least one of the external connectors 11 may be overlapped with the second electronic component 6.

Figure 2:
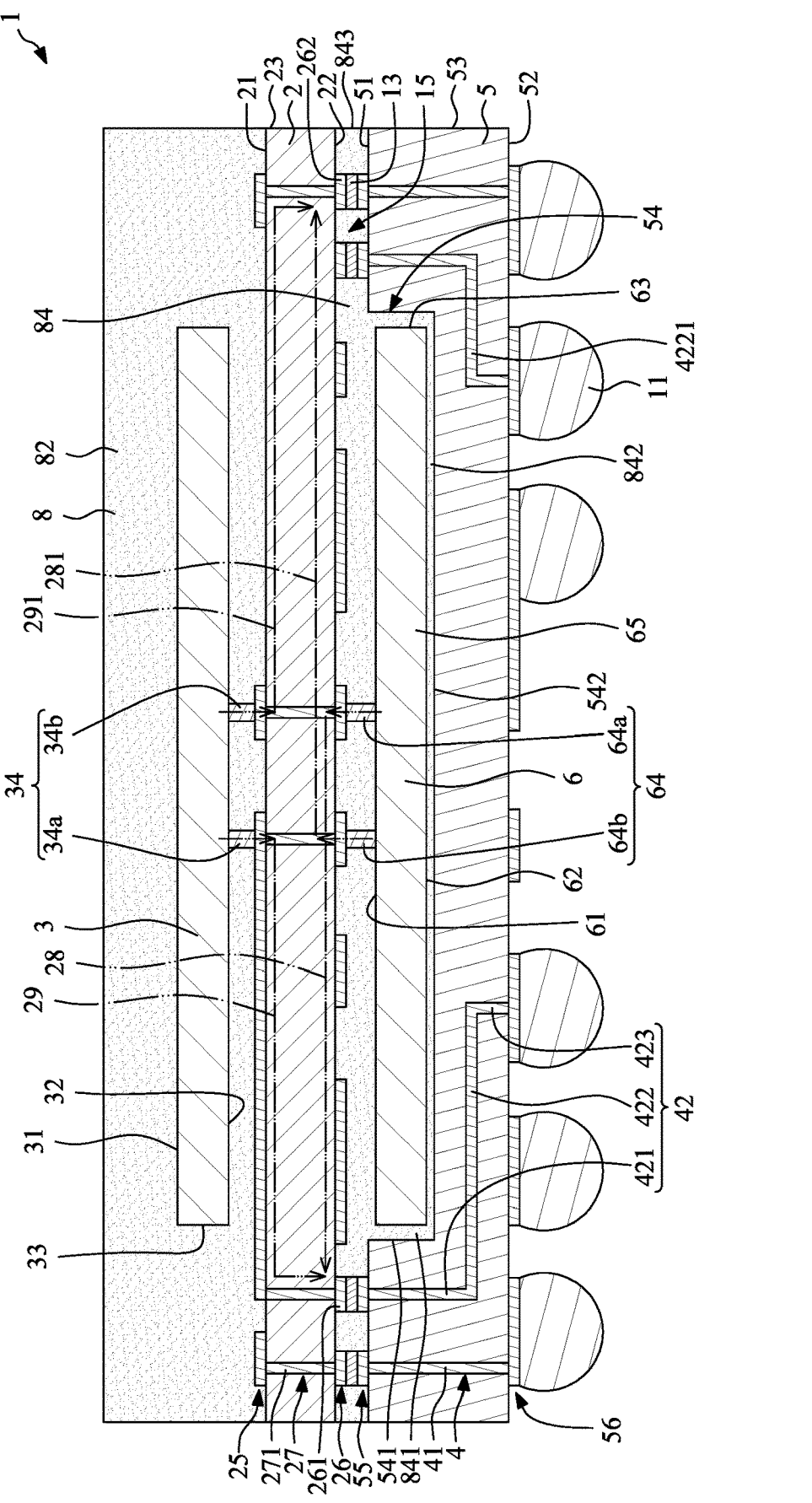
FIG. 2 shows two electrical paths of the package structure of FIG. 1 in accordance with some embodiments of the present disclosure.

FIG. 2 shows two electrical paths of the package structure 1 of FIG. 1 in accordance with some embodiments of the present disclosure. As shown in FIG. 1 and FIG. 2, the chip design of the second electronic component 6 may be same as the chip design of the first electronic component 3. For example, the electrical function of the second bump 64a of the second electronic component 6 may be same as the electrical function of the first bump 34a of the first electronic component 3. The second bump 64a of the second electronic component 6 may be electrically connected to the connecting pad 261 of the second patterned circuit layer 26 of the first substrate 2 through a first electrical path 28. The first bump 34a of the first electronic component 3 may be electrically connected to the connecting pad 261 of the second patterned circuit layer 26 of the first substrate 2 through a second electrical path 29. A length of the first electrical path 28 may be substantially equal to a length of the second electrical path 29.

In addition, the signal transmission characteristics of the second bump 64b of the second electronic component 6 and the first bump 34b of the first electronic component 3 may be same as or similar to the signal transmission characteristics of the second bump 64a of the second electronic component 6 and the first bump 34a of the first electronic component 3, respectively. That is, a length of an electrical path 291 between the first bump 34b of the first electronic component 3 and a connecting pad 262 of the second patterned circuit layer 26 of the first substrate 2 is substantially equal to a length of an electrical path 281 between the second bump 64b of the second electronic component 6 and the same connecting pad 262 of the second patterned circuit layer 26 of the first substrate 2. Therefore, the electrical paths 28, 281 from the second electronic component 6 to a specific contact (e.g., the connecting pad 261, 262) of the first substrate 2 may be consistent with and/or symmetrical with respect to the electrical paths 29, 291 from the first electronic component 3 to the same specific contact (e.g., the connecting pad 261, 262) of the first substrate 2. The undesired signal transmission delay and signal inconsistency between the first electronic component 3 and the second electronic component 6 may be avoided. Further, the electrical property of the package structure 1 may be improved. Thus, the package structure 1 may be used for transmitting high-frequency signals such as 8000 GHz data rate. In addition, the manufacturing process of the package structure 1 may be simplified, and the manufacturing cost of the package structure 1 may be reduced.

Figure 3:
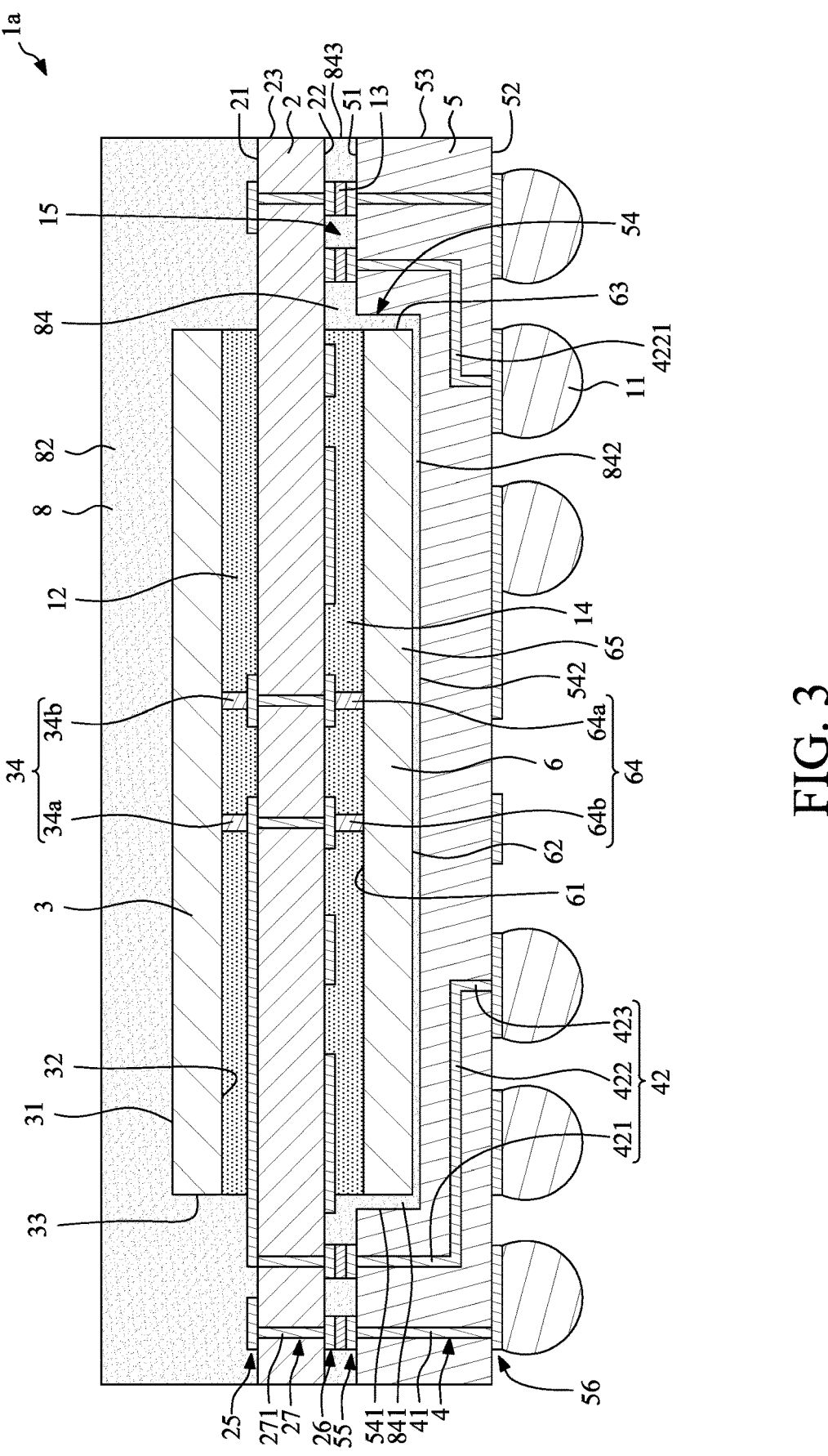
FIG. 3 is a schematic cross-sectional view of a package structure in accordance with some embodiments of the present disclosure.

FIG. 3 is a schematic cross-sectional view of a package structure 1a in accordance with some embodiments of the present disclosure. The package structure 1a may be similar to the package structure 1 of FIG. 1, except that a first adhesion layer 12 and a second adhesion layer 14 further included.

The first active surface 32 of the first electronic component 3 may be adhered to the first surface 21 of the first substrate 2 through the first adhesion layer 12. In some embodiments, the first adhesion layer 12 may include an adhesive material, such as epoxy, a die attach film (DAF), glue or the like. In addition, the second active surface 61 of the second electronic component 6 may be adhered to the second surface 22 of the first substrate 2 through the second adhesion layer 14. In some embodiments, the second adhesion layer 14 may include an adhesive material, such as epoxy, a die attach film (DAF), glue or the like.

Figure 4:
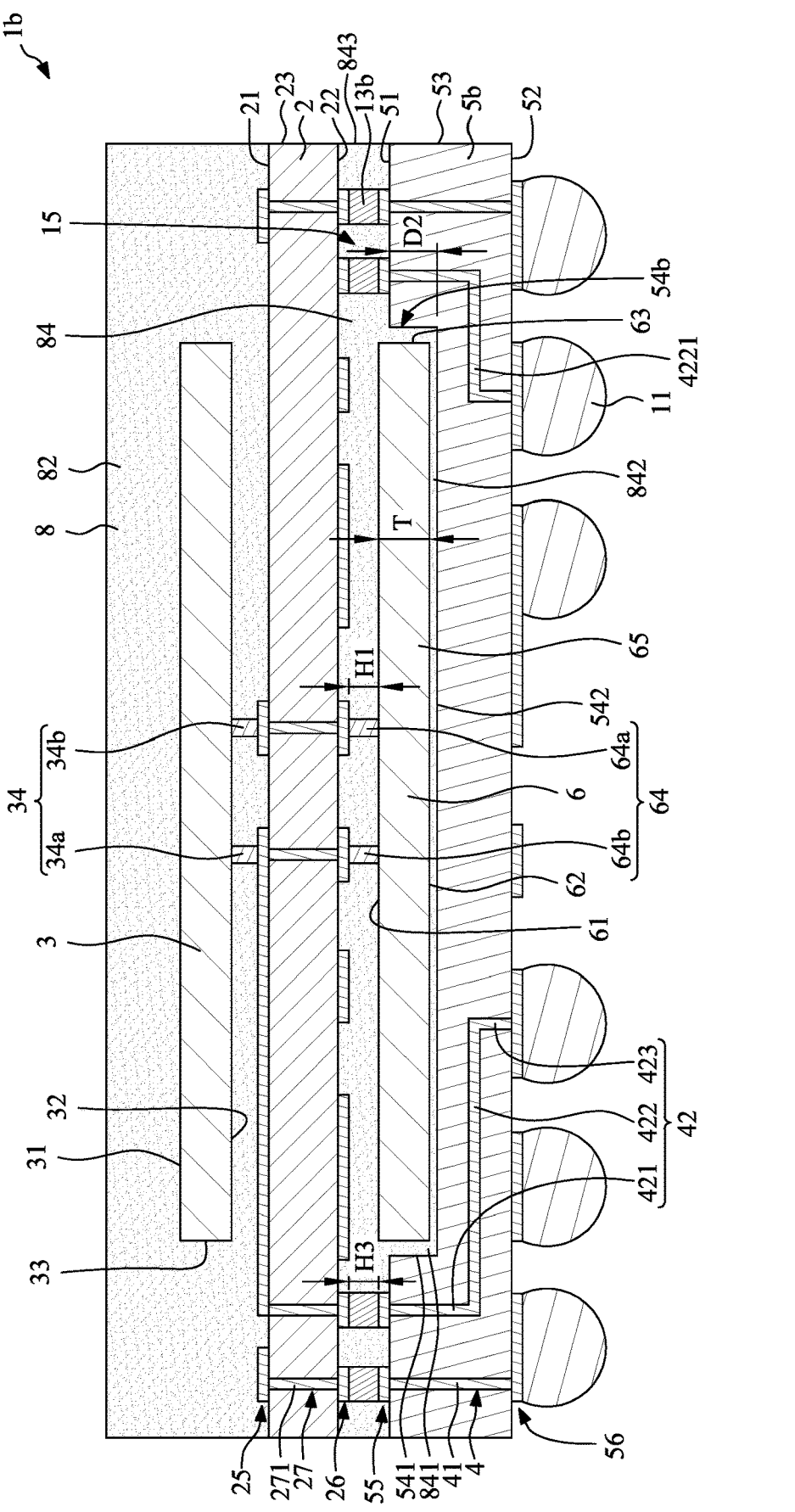
FIG. 4 is a schematic cross-sectional view of a package structure in accordance with some embodiments of the present disclosure.

FIG. 4 is a schematic cross-sectional view of a package structure 1b in accordance with some embodiments of the present disclosure. The package structure 1b may be similar to the package structure 1 of FIG. 1, except for a structure of the second substrate 5b.

A depth D2 of the cavity 54b of the second substrate 5b may be less than the depth D1 of the cavity 54 of the second substrate 5 of FIG. 1. In addition, the depth D2 of the cavity 54b of the second substrate 5b may be less than or equal to the thickness T of the second electronic component 6. Thus, the elevation (or a level) of the second active surface 61 of the second electronic component 6 may be higher than the elevation (or a level) of the first surface 51 (e.g., the top surface) of the second substrate 5b. In some embodiments, a height H3 of the internal connector 13b may be greater than the height H2 of the internal connector 13 of FIG. 1. In addition, the height H3 of the internal connector 13b may be greater than or equal to the height H1 of the second bump 64 (including the second bumps 64a, 64b).

FIG. 5 to FIG. 12 illustrate stages of a method of manufacturing a package structure in accordance with some embodiments of the present disclosure. At least some of these figures have been simplified for a better understanding of the aspects of the present disclosure. In some embodiments, the package structure 1 in FIG. 1 may be manufactured by the operations described below with respect to FIG. 5 to FIG. 12.

Figure 5:
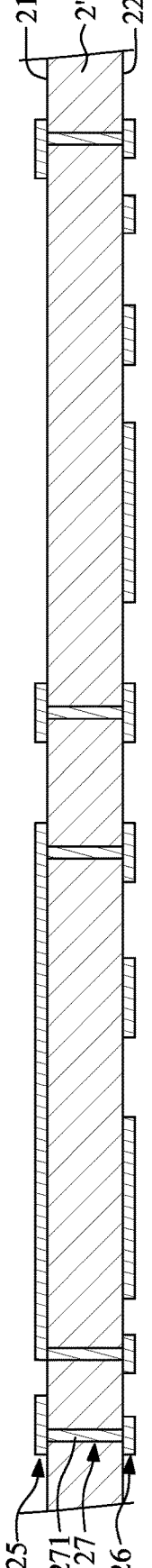
FIG. 5 illustrates one or more stages of a method of manufacturing a package structure in accordance with some embodiments of the present disclosure.
Figure 6:
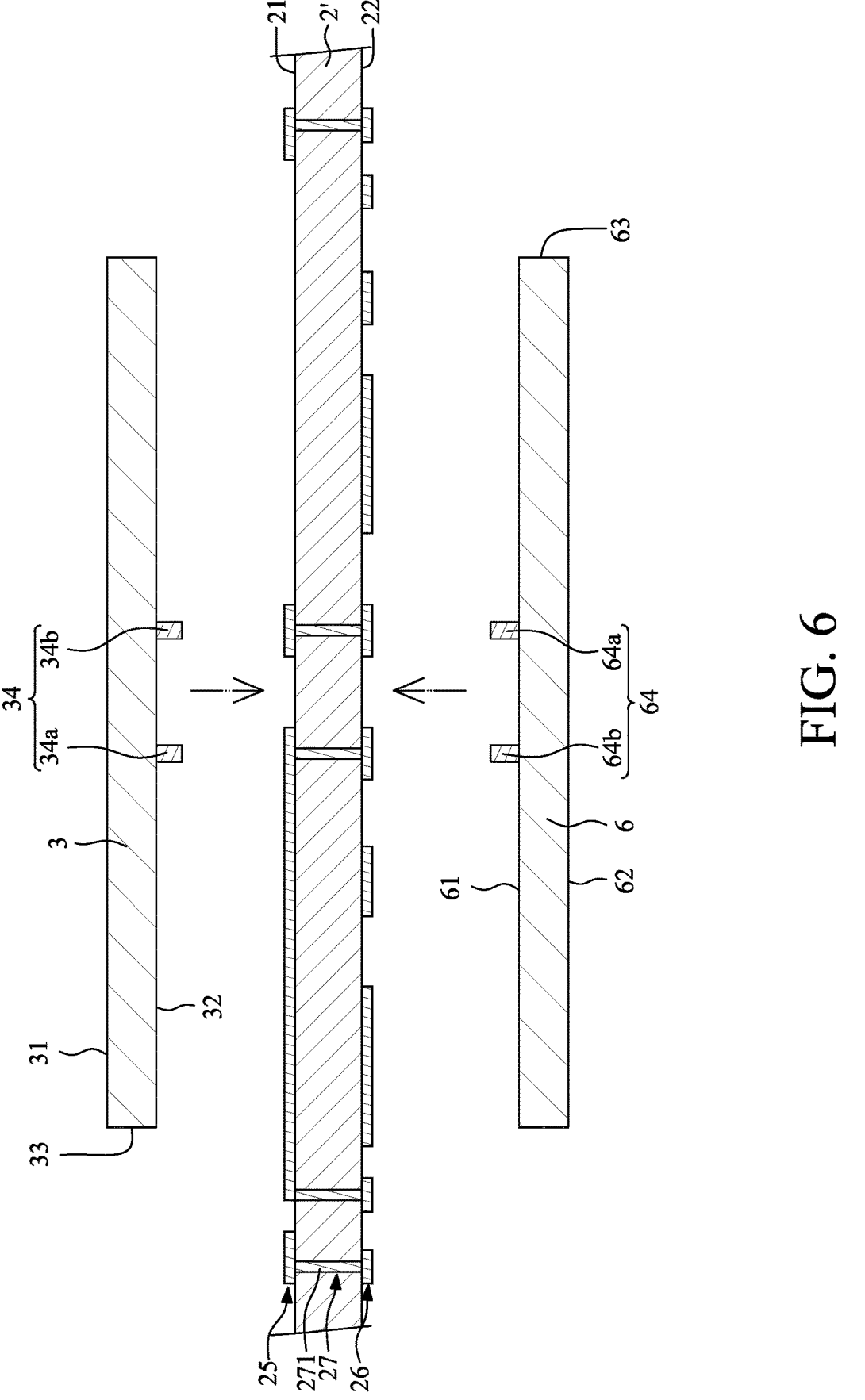
FIG. 6 illustrates one or more stages of a method of manufacturing a package structure in accordance with some embodiments of the present disclosure.
Figure 7:
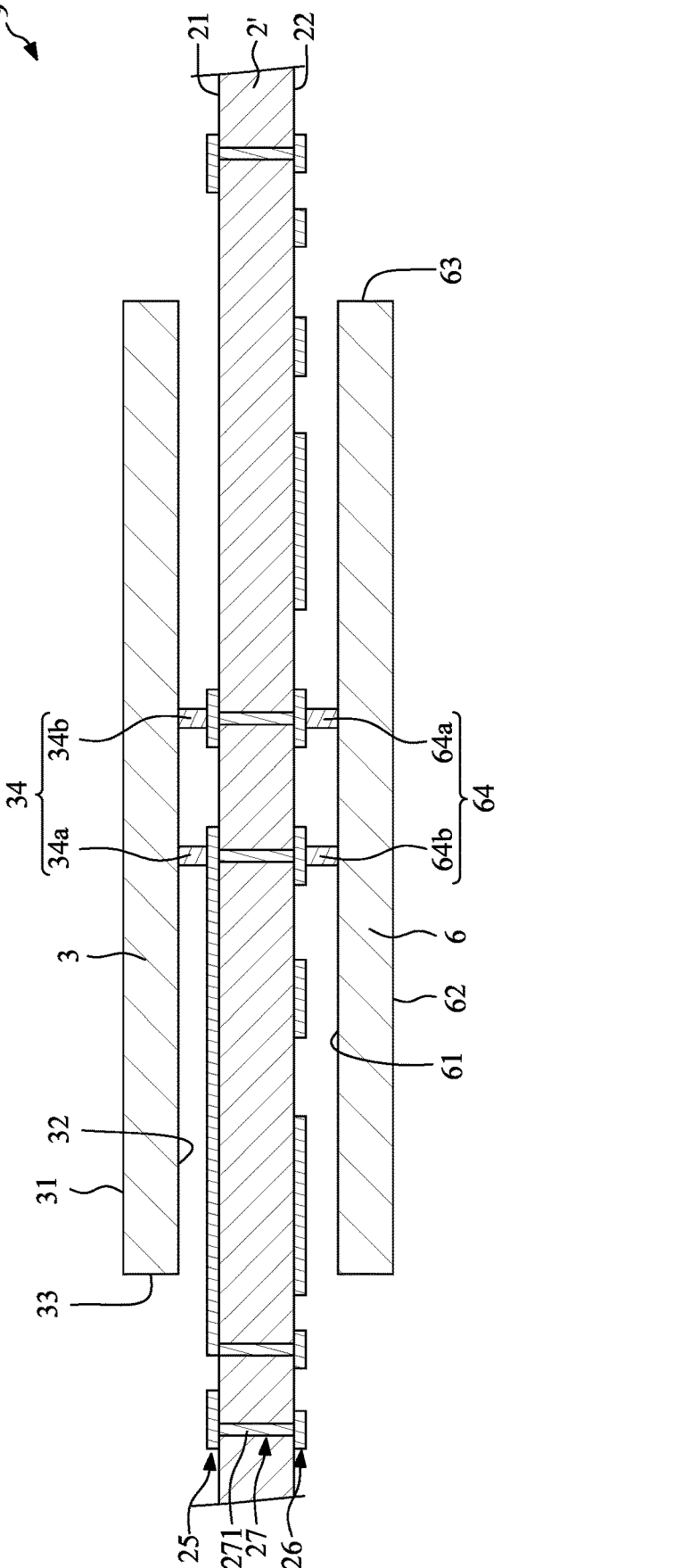
FIG. 7 illustrates one or more stages of a method of manufacturing a package structure in accordance with some embodiments of the present disclosure.

Referring to FIGS. 5 to 7, an assembly structure 9 may be provided. The assembly structure 9 may be formed as following stages.

Referring to FIG. 5, a first substrate 2' may be provided. The first substrate 2' may include semiconductor materials such as silicon, germanium, gallium, arsenic, and combinations thereof. In some embodiments, the first substrate 2' may include organic material, glass, ceramic material or the like. For example, the first substrate 2' may be made of a cured photoimageable dielectric (PID) material such as epoxy or polyimide (PI) including photoinitiators. For example, the first substrate 2' may include a homogeneous material. For example, the material of the first substrate 2' may include epoxy type FR5, FR4, Bismaleimide triazine (BT), print circuit board (PCB) material, Prepreg (PP), Ajinomoto build-up film (ABF) or other suitable materials.

The first substrate 2' may have a first surface 21 (e.g., a top surface) and a second surface 22 (e.g., a bottom surface). The second surface 22 (e.g., the bottom surface) may be opposite to the first surface 21 (e.g., the top surface). The first substrate 2' may include a first patterned circuit layer 25, a second patterned circuit layer 26 and a first inner connection structure 27. The first patterned circuit layer 25 may be disposed adjacent to the first surface 21 (e.g., the top surface) of the first substrate 2'. The first patterned circuit layer 25 may be a fan-out circuit layer or a redistribution layer (RDL). The first patterned circuit layer 25 may be disposed on the first surface 21 (e.g., the top surface) of the first substrate 2'. A material of the first patterned circuit layer 25 may include copper (Cu), silver (Ag), aluminum (Al), gold (Au), or an alloy thereof. For example, the first patterned circuit layer 25 may be formed or patterned from a metal foil such as a copper foil. The first patterned circuit layer 25 may include a plurality of traces and a plurality of connecting pads.

The second patterned circuit layer 26 may be disposed adjacent to the second surface 22 (e.g., the bottom surface) of the first substrate 2'. The second patterned circuit layer 26 may be a fan-out circuit layer or a redistribution layer (RDL). The second patterned circuit layer 26 may be disposed on the second surface 22 (e.g., the bottom surface) of the first substrate 2'. A material of the second patterned circuit layer 26 may include copper (Cu), silver (Ag), aluminum (Al), gold (Au), or an alloy thereof. For example, the second patterned circuit layer 26 may be formed or patterned from a metal foil such as a copper foil. The second patterned circuit layer 26 may include a plurality of traces and a plurality of connecting pads.

The first inner connection structure 27 may be disposed in the first substrate 2', and may be used for electrically connecting the first patterned circuit layer 25 and the second patterned circuit layer 26 of the first substrate 2'. In some embodiments, the first inner connection structure 27 may include a plurality of through vias 271 disposed in the first substrate 2' and extending through the first substrate 2'. That is, the through vias 271 may extend between the first surface 21 (e.g., the top surface) and the second surface 22 (e.g., the bottom surface). Two ends of the through via 271 may be connected to the first patterned circuit layer 25 and the second patterned circuit layer 26 respectively. Thus, the first substrate 2' may be a double-sided substrate or a double-sided copper-clad substrate or a double-sided copper foil substrate.

Referring to FIG. 6, a first electronic component 3 may be provided. The first electronic component 3 may include a semiconductor die or a chip, such as a memory die (e.g., dynamic random access memory (DRAM) die, static random access memory (SRAM) die, etc.), a signal processing die (e.g., digital signal processing (DSP) die), a logic die (e.g., application processor (AP), system-on-a-chip (SoC), central processing unit (CPU), graphics processing unit (GPU), microcontroller, etc.), a power management die (e.g., power management integrated circuit (PMIC) die), a radio frequency (RF) die, a sensor die, a micro-electro-mechanical-system (MEMS) die, a front-end die (e.g., analog front-end (AFE) dies) or other active components.

The first electronic component 3 may be disposed over the first surface 21 of the first substrate 2'. The first electronic component 3 may have a first active surface 32 (e.g., a bottom surface), a first backside surface 31 (e.g., a top surface) and a plurality of first lateral surfaces 33. The first active surface 32 (e.g., the bottom surface) may face the first substrate 2'. The first backside surface 31 (e.g., the top surface) may be opposite to the first active surface 32 and may face away from the first substrate 2'. The first lateral surfaces 33 may extend between the first active surface 32 and the first backside surface 31.

The first electronic component 3 may include at least one first bump 34 disposed adjacent to the first active surface 32 of the first electronic component 3. The first bump 34 may include an electrical contact such as a pad, a pillar, or a stud. For example, the first bump 34 may include a first bump 34a and a first bump 34b.

In some embodiments, a second electronic component 6 may be also provided. The second electronic component 6 may include a semiconductor die or a chip, such as a memory die (e.g., dynamic random access memory (DRAM) die, static random access memory (SRAM) die, etc.), a signal processing die (e.g., digital signal processing (DSP) die), a logic die (e.g., application processor (AP), system-on-a-chip (SoC), central processing unit (CPU), graphics processing unit (GPU), microcontroller, etc.), a power management die (e.g., power management integrated circuit (PMIC) die), a radio frequency (RF) die, a sensor die, a micro-electro-mechanical-system (MEMS) die, a front-end die (e.g., analog front-end (AFE) dies) or other active components.

The second electronic component 6 may be disposed under the second surface 22 of the first substrate 2'. The second electronic component 6 may have a second active surface 61 (e.g., a top surface), a second backside surface 62 (e.g., a bottom surface) and a plurality of second lateral surfaces 63. The second active surface 61 (e.g., the top surface) may face the first substrate 2'. The second backside surface 62 (e.g., the bottom surface) may be opposite to the second active surface 61 and may face away from the first substrate 2'. The second lateral surfaces 63 may extend between the second active surface 61 and the second backside surface 62.

The second electronic component 6 may include at least one second bump 64 disposed adjacent to the second active surface 61 of the second electronic component 6. The second bump 64 may include an electrical contact such as a pad, a pillar, or a stud. For example, the second bump 64 may include a second bump 64a and a second bump 64b.

Referring to FIG. 7, the first electronic component 3 may be attached to the first surface 21 of the first substrate 2'. Thus, the first active surface 32 of the first electronic component 3 may be electrically connected to the first patterned circuit layer 25 of the first substrate 2' through the first bump(s) 34a, 34b. That is, the first electronic component 3 may be electrically connected to and attached to the first substrate 2' through flip-chip bonding. In addition, the second electronic component 6 may be attached to the second surface 22 of the first substrate 2'. Thus, the second active surface 61 of the second electronic component 6 may be electrically connected to the second patterned circuit layer 26 of the first substrate 2' through the second bump(s) 64a, 64b. That is, the second electronic component 6 may be electrically connected to and attached to the first substrate 2' through flip-chip bonding.

Meanwhile, the assembly structure 9 may be formed. The assembly structure 9 may include the first substrate 2', the first electronic component 3 and the second electronic component 6.

Figure 8:
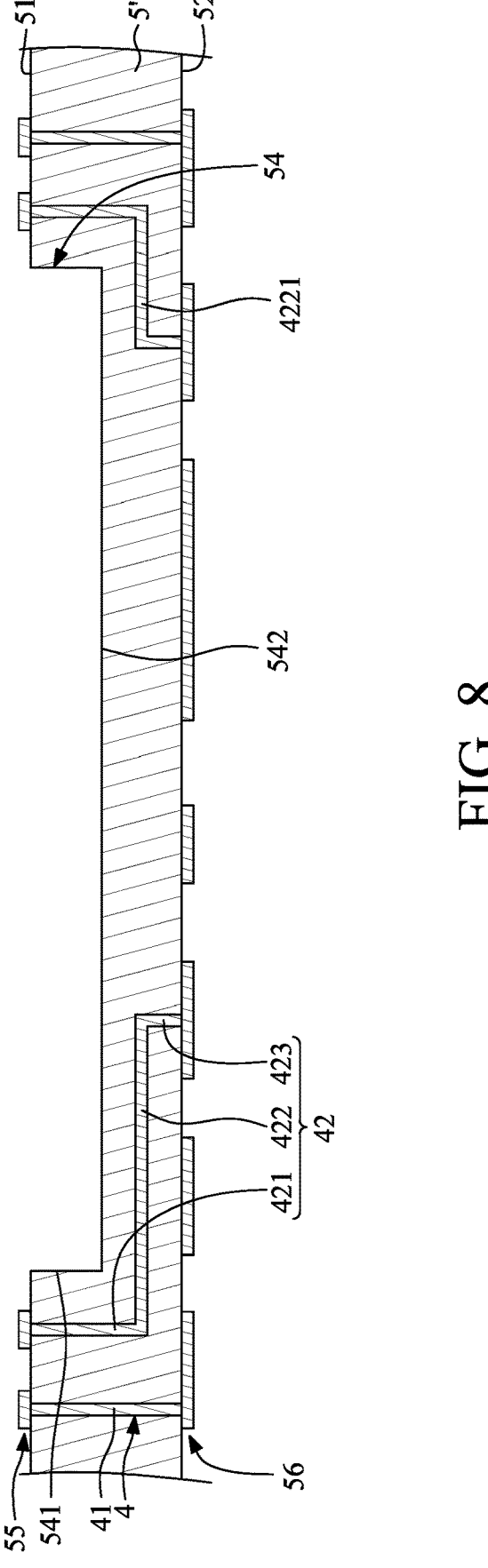
FIG. 8 illustrates one or more stages of a method of manufacturing a package structure in accordance with some embodiments of the present disclosure.

Referring to FIG. 8, a second substrate 5' may be provided. In some embodiments, the second substrate 5 'may include semiconductor materials such as silicon, germanium, gallium, arsenic, and combinations thereof. In some embodiments, the second substrate 5' may include organic material, glass, ceramic material or the like. For example, the second substrate 5' may be made of a cured photoimageable dielectric (PID) material such as epoxy or polyimide (PI) including photoinitiators. For example, the second substrate 5' may include a homogeneous material. For example, the material of the second substrate 5' may include epoxy type FR5, FR4, Bismaleimide triazine (BT), print circuit board (PCB) material, Prepreg (PP), Ajinomoto build-up film (ABF) or other suitable materials.

The second substrate 5' may have a first surface 51 (e.g., a top surface) and a second surface 52 (e.g., a bottom surface). The second surface 52 (e.g., the bottom surface) may be opposite to the first surface 51 (e.g., the top surface).

The second substrate 5' may define a cavity 54 recessed from the first surface 51 (e.g., the top surface) of the second substrate 5'. The cavity 54 may have a plurality of sidewalls 541 (or a plurality of side surfaces) and a bottom wall 542 (or a bottom surface). The sidewalls 541 of the cavity 54 may extend between the first surface 51 (e.g., the top surface) of the second substrate 5' and the bottom wall 542 of the cavity 54.

The second substrate 5' may include a first patterned circuit layer 55, a second patterned circuit layer 56 and a second inner connection structure 4. The first patterned circuit layer 55 may be disposed adjacent to the first surface 51 (e.g., the top surface) of the second substrate 5. The first patterned circuit layer 55 may be a fan-out circuit layer or a redistribution layer (RDL). The first patterned circuit layer 55 may be disposed on the first surface 51 (e.g., the top surface) of the second substrate 5. A material of the first patterned circuit layer 55 may include copper (Cu), silver (Ag), aluminum (Al), gold (Au), or an alloy thereof. For example, the first patterned circuit layer 55 may be formed or patterned from a metal foil such as a copper foil. The first patterned circuit layer 55 may include a plurality of traces and a plurality of connecting pads.

The second patterned circuit layer 56 may be disposed adjacent to the second surface 52 (e.g., the bottom surface) of the second substrate 5'. The second patterned circuit layer 56 may be a fan-out circuit layer or a redistribution layer (RDL). The second patterned circuit layer 56 may be disposed on the second surface 52 (e.g., the bottom surface) of the second substrate 5'. A material of the second patterned circuit layer 56 may include copper (Cu), silver (Ag), aluminum (Al), gold (Au), or an alloy thereof. For example, the second patterned circuit layer 56 may be formed or patterned from a metal foil such as a copper foil. The second patterned circuit layer 56 may include a plurality of traces, a plurality of connecting pads and a plurality of bonding pads. Each of the bonding pads may be an input/output (I/O) terminal pad (such as a ball pad).

The second inner connection structure 4 may be disposed in the second substrate 5', and may be used for electrically connecting the first patterned circuit layer 55 and the second patterned circuit layer 56 of the second substrate 5'. In some embodiments, the second inner connection structure 4 may include a plurality of through vias 41 and at least one interconnection structure 42. The through vias 41 may be disposed in the second substrate 5' and extend through the second substrate 5'. That is, the through vias 41 may extend between the first surface 51 (e.g., the top surface) and the second surface 52 (e.g., the bottom surface). Two ends of the through via 41 may be connected to the first patterned circuit layer 55 and the second patterned circuit layer 56 respectively.

The interconnection structure 42 may be disposed in the second substrate 5', and may include a first vertical conductive segment 421, a horizontal conductive segment 422 and a second vertical conductive segment 423. At least a portion 4221 of the horizontal conductive segment 422 may be disposed under the cavity 54, and may be spaced apart from the bottom wall 542 of the cavity 54. Further, the horizontal conductive segment 422 may be spaced apart from the second surface 52 (e.g., the bottom surface) of the second substrate 5'. Thus, the horizontal conductive segment 422 may be not exposed from the second substrate 5'. The first vertical conductive segment 421 physically connects and electrically connects the first patterned circuit layer 55 and the horizontal conductive segment 422. The second vertical conductive segment 423 physically connects and electrically connects the second patterned circuit layer 56 and the horizontal conductive segment 422.

Figure 9:
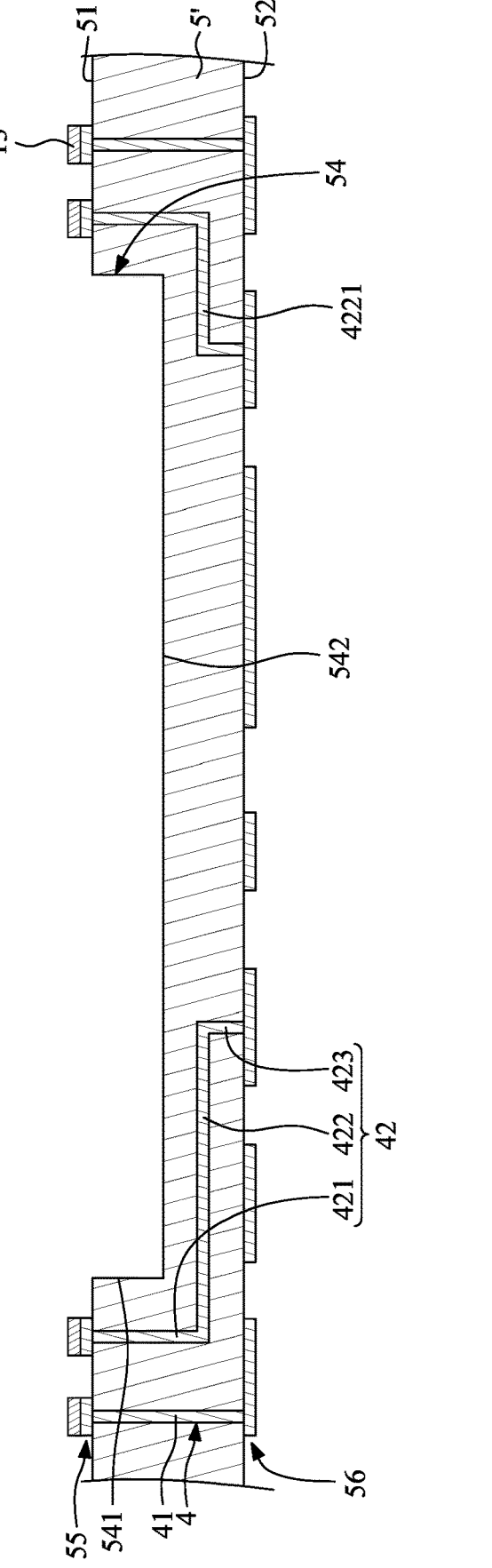
FIG. 9 illustrates one or more stages of a method of manufacturing a package structure in accordance with some embodiments of the present disclosure.

Referring to FIG. 9, at least one internal connector 13 may be formed on the connecting pad of the first patterned circuit layer 55 of the second substrate 5'.

Figure 10:
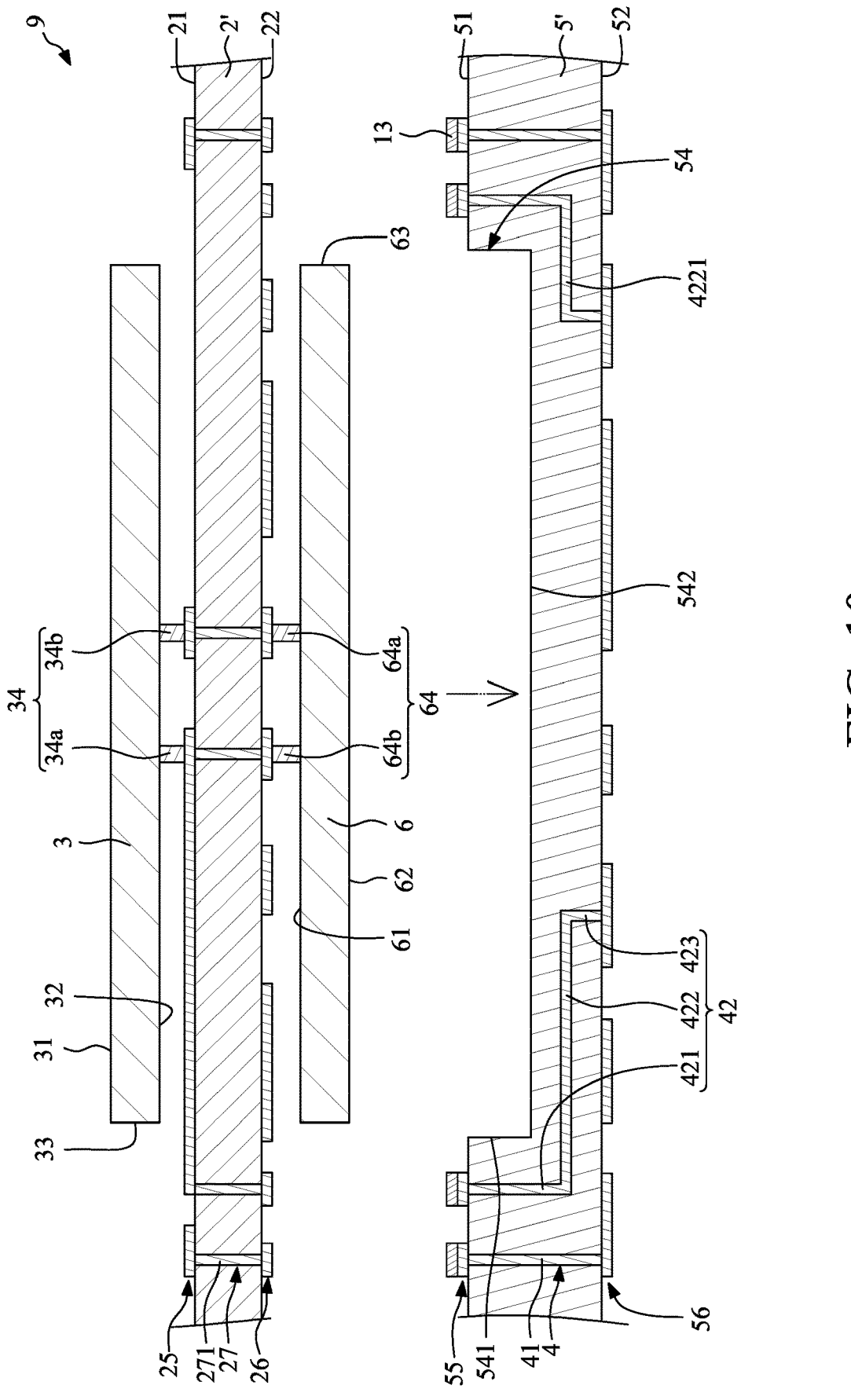
FIG. 10 illustrates one or more stages of a method of manufacturing a package structure in accordance with some embodiments of the present disclosure.

Referring to FIG. 10, the second substrate 5' may be disposed under the assembly structure 9. Alternatively, the assembly structure 9 may be disposed above the second substrate 5'.

Figure 11:
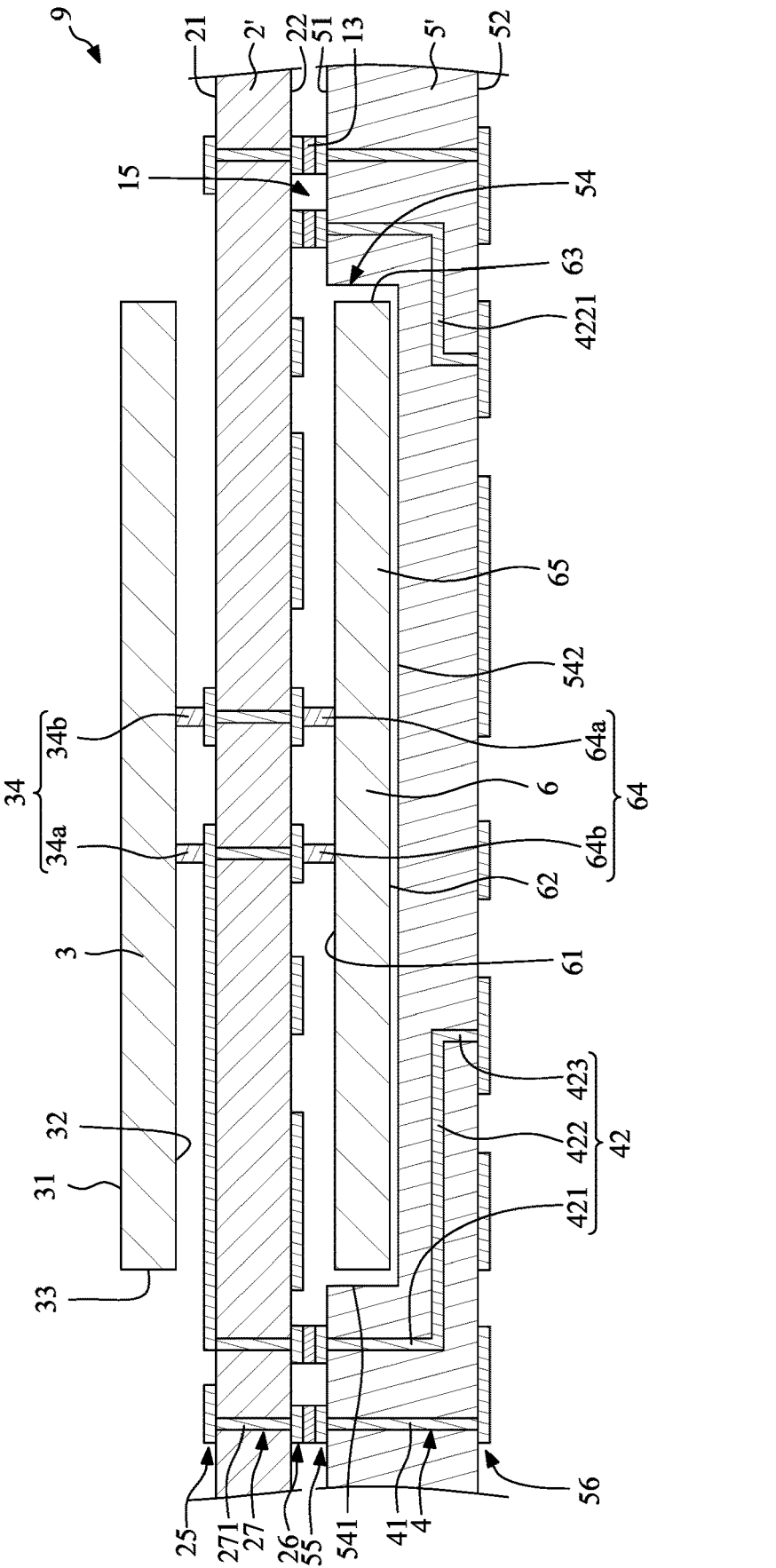
FIG. 11 illustrates one or more stages of a method of manufacturing a package structure in accordance with some embodiments of the present disclosure.

Referring to FIG. 11, the second substrate 5' may be attached and electrically connected to the first substrate 2' of the assembly structure 9 through the internal connector 13. The cavity 54 of the second substrate 5' may be used for accommodating at least a portion 65 of the second electronic component 6. Alternatively, at least a portion 65 of the second electronic component 6 may be located in the cavity 54 of the second substrate 5'. The second electronic component 6 may not contact or electrically connect the sidewalls 541 and the bottom wall 542 of the cavity 54. In addition, a space 15 may be formed between the second surface 22 of the first substrate 2' and the first surface 51 of the second substrate 5'.

Figure 12:
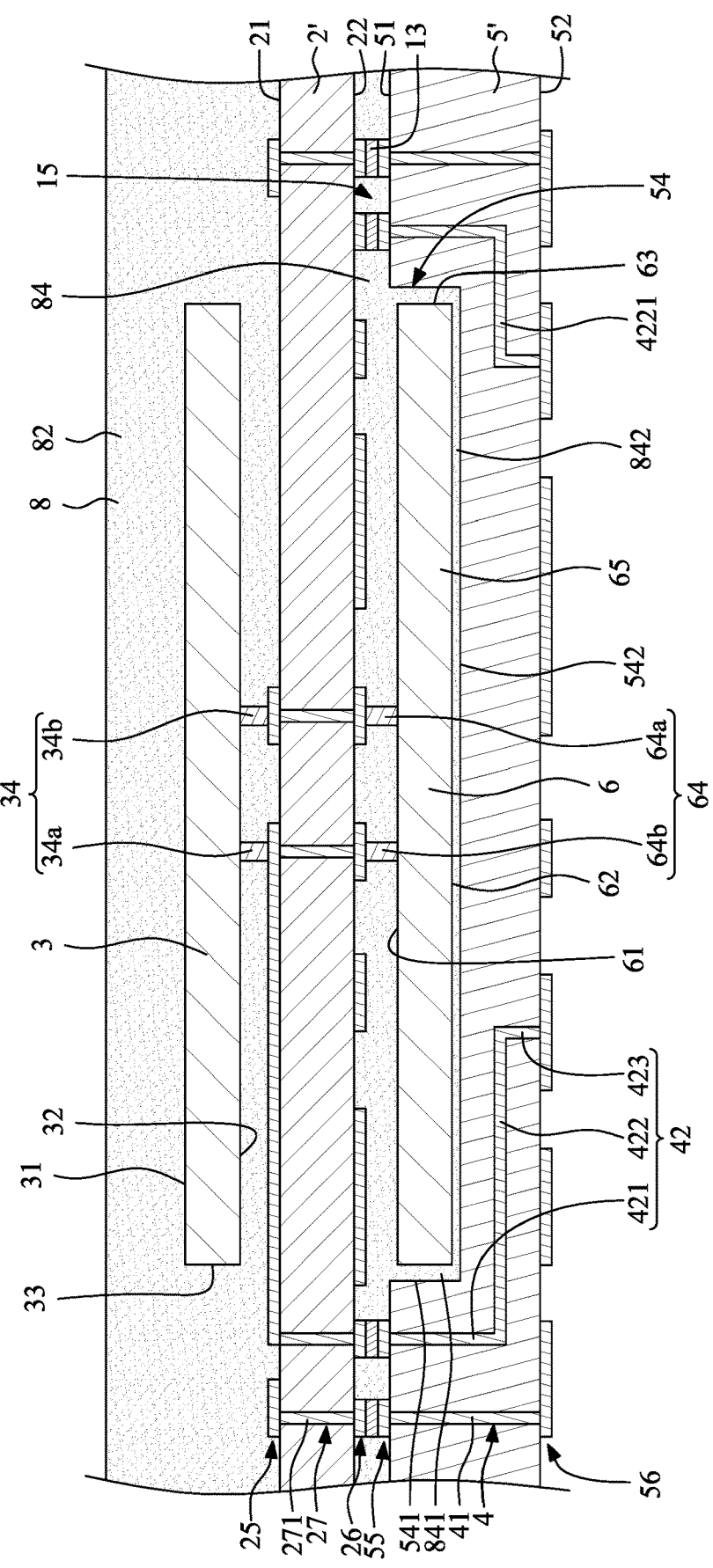
FIG. 12 illustrates one or more stages of a method of manufacturing a package structure in accordance with some embodiments of the present disclosure.

Referring to FIG. 12, a package body 8 may be formed or disposed to encapsulate the assembly structure 9, the first surface 51 of the second substrate 5' and the cavity 54 of the second substrate 5'. In some embodiments, the package body 8 may be formed by a molding technique, such as transfer molding or compression molding. The package body 8 may include a first encapsulant 82 and a second encapsulant 84 formed concurrently. The first encapsulant 82 may be formed to cover the first surface 21 of the first substrate 2' and encapsulate the first electronic component 3. The second encapsulant 84 may be formed to cover the second surface 22 of the first substrate 2' and the first surface 51 of the second substrate 5'. The second encapsulant 84 may fill up the cavity 54 and encapsulate the second electronic component 6. The second encapsulant 84 may further encapsulate the internal connectors 13.

The second encapsulant 84 may include a first portion 841 and a second portion 842. The first portion 841 may be disposed between the second lateral surfaces 63 of the second electronic component 6 and the sidewalls 541 of the cavity 54. The second portion 842 may be disposed between the second backside surface 62 (e.g., the bottom surface) of the second electronic component 6 and the bottom wall 542 of the cavity 54. Thus, the second encapsulant 84 may encapsulate the second backside surface 62 (e.g., the bottom surface) and the second lateral surfaces 63 of the second electronic component 6. The second encapsulant 84 may be disposed between the second electronic component 6 and the plurality of walls (including the sidewalls 541 and the bottom wall 542) of the cavity 54.

In addition, a portion of the second encapsulant 84 may extend to the space 15 between the second surface 22 of the first substrate 2' and the first surface 51 of the second substrate 5'.

Then, one or more external connectors 11 may be formed or disposed on the bonding pads of the second patterned circuit layer 56 of the second substrate 5' so as to provide electrical connections, for example, I/O connections, of the second substrate 5'. In some embodiments, the operation of forming the external connectors 11 may be conducted before the operation of forming the package body 8.

Then, a singulation process may be conducted to form the package structure 1 of FIG. 1.

FIG. 13 illustrates a flow chart of a method 100 of manufacturing a package structure 1 in accordance with some embodiments of the present disclosure.

The step or operation S101 is providing an assembly structure including a first substrate, a first electronic component electrically connected to the first substrate and a second electronic component electrically connected to the first substrate. For example, as shown in FIG. 7, an assembly structure 9 is provided. The assembly structure 9 may include a first substrate 2', a first electronic component 3 and a second electronic component 6. The first electronic component 3 may be electrically connected to the first substrate 2'. The second electronic component 6 may be electrically connected to the first substrate 2'.

The step or operation S102 is attaching and electrically connecting a second substrate to the first substrate of the assembly structure, wherein the second substrate defines a cavity for accommodating the second electronic component. For example, as shown in FIG. 11, a second substrate 5' is attached and electrically connected to the first substrate 2' of the assembly structure 9. The second substrate 5' may define a cavity 54 for accommodating the second electronic component 6.

One aspect of the present disclosure provides a package structure. The package structure includes a first substrate, a first electronic component, a second electronic component and a second substrate. The first electronic component is disposed over and electrically connected to the first substrate. An active surface of the first electronic component faces the first substrate. The second electronic component is disposed under and electrically connected to the first substrate. An active surface of the second electronic component faces the first substrate. The second substrate is disposed under and electrically connected to the first substrate. The second substrate defines a cavity for accommodating the second electronic component.

Another aspect of the present disclosure provides a package structure. The package structure includes a first substrate, a first electronic component, a second electronic component and a second substrate. The first electronic component is electrically connected to the first substrate. The second electronic component is electrically connected to the first substrate. The first substrate is disposed between the first electronic component and the second electronic component. The second substrate is spaced apart from and electrically connected to the first substrate. At least a portion of the second electronic component is embedded in the second substrate.

Another aspect of the present disclosure provides a method of manufacturing a package structure. The method includes: providing an assembly structure including a first substrate, a first electronic component electrically connected to the first substrate and a second electronic component electrically connected to the first substrate; and attaching and electrically connecting a second substrate to the first substrate of the assembly structure, wherein the second substrate defines a cavity for accommodating the second electronic component.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package structure, comprising:
   a first substrate;
   a first electronic component electrically connected to the first substrate;
   a second electronic component electrically connected to the first substrate, wherein the first substrate is disposed between the first electronic component and the second electronic component;
   a second substrate spaced apart from and electrically connected to the first substrate, wherein at least a portion of the second electronic component is embedded in the second substrate; and
   a plurality of external connectors attached to and electrically connected to the second substrate for external connection, wherein at least one of the plurality of external connectors is overlapped with the second electronic component;
   wherein a first circuit layout of the first electronic component is a same as a second circuit layout of the second electronic component.

2. The package structure of claim 1, wherein the second substrate defines a cavity for accommodating the at least a portion of the second electronic component, wherein the second electronic component is electrically insulated from all of a plurality of walls of the cavity.

3. The package structure of claim 2, wherein a depth of the cavity is greater than a thickness of the second electronic component.

4. The package structure of claim 2, further comprising an encapsulant encapsulating a bottom surface and a plurality of lateral surfaces of the second electronic component, wherein the encapsulant is disposed between the second electronic component and the plurality of walls of the cavity.

5. The package structure of claim 1, further comprising an encapsulant encapsulating the second electronic component, wherein the encapsulant extends to a space between the first substrate and the second substrate.

6. The package structure of claim 5, wherein a lateral surface of the encapsulant is aligned with a lateral surface of the second substrate.

7. The package structure of claim 1, wherein the first electronic component comprises a first active surface facing the first substrate and at least one first bump provided thereon and electrically connected to the first substrate, the second electronic component comprises a second active surface facing the first substrate and at least one second bump provided thereon electrically connected to the first substrate, and the at least one first bump is aligned with the at least one second bump, wherein the first circuit layout is provided on the first active surface while the second circuit layout is provided on the second active surface.

8. The package structure of claim 1, wherein the second substrate further includes a second inner connection structure for electrically connecting a first surface and a second surface of the second substrate, wherein the second inner connection structure includes at least one vertical conductive segment and at least one horizontal conductive segment.

9. The package structure of claim 8, wherein the at least one horizontal conductive segment is not exposed from the second substrate.

10. The package structure of claim 8, wherein a portion of the at least one horizontal conductive segment is located right under the second electronic component.

11. The package structure of claim 1, further comprising at least one internal connector physically connecting and electrically connecting the first substrate and the second substrate, wherein the second electronic component includes at least one second bump electrically connected to the first substrate, and a height of the at least one second bump is greater than a height of the at least one internal connector.

\* \* \* \* \*